United States Patent
Tsubouchi et al.

[19]

[11] Patent Number: 5,840,594
[45] Date of Patent: Nov. 24, 1998

[54] METHOD OF AND APPARATUS FOR MOUNTING ELECTRONIC PARTS ON A BOARD

[75] Inventors: Yuzo Tsubouchi, Onojo; Nobutaka Abe, Dazaifu; Yuji Nakamura, Kurume, all of Japan

[73] Assignee: Matsushita Electric Industrial Co., Ltd., Osaka, Japan

[21] Appl. No.: 929,420

[22] Filed: Sep. 15, 1997

[30] Foreign Application Priority Data

Sep. 27, 1996 [JP] Japan .................................. 8-256115

[51] Int. Cl.⁶ .................................................. H01L 21/66
[52] U.S. Cl. .................................................. 438/15; 438/14
[58] Field of Search .................................. 438/14, 15, 67, 438/106

[56] References Cited

U.S. PATENT DOCUMENTS

| | | | |
|---|---|---|---|
| 5,059,559 | 10/1991 | Takahashi et al. | 438/15 |
| 5,324,381 | 6/1994 | Nishiguchi | 438/15 |
| 5,444,388 | 8/1995 | Ideta et al. | 438/15 |
| 5,549,716 | 8/1996 | Takahashi et al. | 438/15 |

FOREIGN PATENT DOCUMENTS 370920  11/1991  Japan .

Primary Examiner—Kevin Picardat
Attorney, Agent, or Firm—Stevens, Davis, Miller & Mosher, L.L.P.

[57] ABSTRACT

A first camera detects a positional relationship among first, second and third nozzles. A second camera detects pick-up positions of chips in parts feeders. Tolerance zones for the respective chips are determined, within which the nozzle can pick up the chip. When one of nozzles is placed in the corresponding pick-up position, it is judged whether or not other nozzles are located within the corresponding tolerance zones, respectively. If the judgment result is "YES", the nozzles pick up the chips simultaneously, and if this result is "NO", the nozzles pick up the chips separately.

5 Claims, 14 Drawing Sheets

SIMULTANEOUS PICKING-UP DECISION PROCEDURE

METHOD OF AND APPARATUS FOR MOUNTING ELECTRONIC PARTS ON A BOARD

BACKGROUND OF THE INVENTION

1. Field of the Invention

The present invention relates to an electronic parts mounting method in which electronic parts in parts feeders are picked up by a plurality of nozzles provided in a head, and are transferred to and mounted on a board. The present invention also relates to an apparatus for transferring and mounting the electric parts onto the board.

2. Related Art

There has been extensively used the type of electronic parts mounting apparatus for transferring and mounting electronic parts (hereinafter referred to as "chips") on a board. In such apparatus, a head is moved horizontally in X-direction and Y-direction by a moving table, a chip in a parts feeder is picked up by a lower end of a nozzle on the head by means of vacuum, and transferred to a predetermined position above the board and mounted thereon.

There has been proposed another electronic parts mounting apparatus in Japanese Patent Examined Publication No. 3-70920. In the apparatus, the chips in a plurality of parts feeders juxtaposed at intervals are simultaneously vacuum picked up by a plurality of nozzles mounted in a row at intervals on a head (this operation will be referred to as "simultaneous picking-up" in the present specification), and are transferred to and mounted on a board. This apparatus has an advantage that the mounting efficiency is greatly enhanced since the plurality of electronic parts are simultaneously picked up at a time by the plurality of nozzles.

However, in the simultaneous picking-up type electronic parts mounting apparatus, the rate of chip pick-up mistake is higher as compared with the type of electronic parts mounting apparatus for picking up a chip in one parts feeder by one nozzle. The cause for this is mainly due to the following reasons.

In the simultaneous picking-up type apparatus, the nozzle interval is set to an integral multiple of the parts feeder interval so that the chips in the plurality of parts feeders can be simultaneously picked up by the plurality of nozzles. However, because of various errors (including an error in the installing of the nozzles on the head, an error in the assembling of the parts feeders, and an error in the juxtaposition of the parts feeders), the nozzle interval fails to be accurately an integral multiple of the parts feeder interval (more correctly, the chip pick-up position interval among the parts feeders), and a slight interval error is inevitable. Because of this interval error, all of the plurality of nozzles could not simultaneously pick up the chips in the parts feeders, so that a pick-up mistake was liable to occur.

SUMMARY OF THE INVENTION

It is therefore an object of the present invention to provide an electronic parts mounting method in which a chip pick-up mistake is eliminated on the simultaneous picking-up.

Further, it is another object of the present invention to provide an apparatus capable of simultaneous picking-up without a chip pick-up mistake.

To this end, according to the present invention, there is provided an electronic parts mounting method for horizontally moving a head with a plurality of nozzles arranged at a first interval therebetween, and for picking-up electronic parts from plural ones of numbers of parts feeders arranged at a second interval therebetween by means of the nozzles, the first interval being an integral multiple of the second interval, and for mounting the electronic parts onto a board, comprising the steps of:

detecting a positional relationship among the nozzles by a first camera, and storing data of the detected positional relationship in a storage portion;

detecting pick-up points of the electronic parts in the plural parts feeders by a second camera, and storing data of the detected pick-up points in a storage portion;

judging, in accordance with the positional relationship data and the pick-up point data, whether or not all of the electronic parts can be simultaneously picked up by the nozzles;

picking up the electronic parts by the nozzles simultaneously when it is judged that all of the electronic parts can be simultaneously picked up, or separately when it is judged that all of the electronic parts can not be simultaneously picked up; and transferring and mounting the electronic parts on said board.

Further, according to another respect of the present invention, there is also provided an apparatus for picking up electronic parts from plural parts feeders by plural nozzles and mounting them onto a board, comprising:

a positioning portion on which the board is placed;

numbers of parts feeders arranged at a first interval, including the plural parts feeders;

a head having the plural nozzles mounted thereon at a second interval which is an integral multiple of the first interval;

a table for horizontally moving the head;

a first camera for detecting a positional relationship among the plural nozzles;

a second camera for detecting pick-up points of the electronic parts;

a storage means for storing the data of the nozzle positional relationship and the data of the pick-up points;

means for judging, in accordance with the nozzle positional relationship data and the pick-up point data, whether or not all of the plural electronic parts can be simultaneously picked up by the plural nozzles; and means for controlling the nozzles to pick up all of the electronic parts simultaneously when it is judged that the electronic parts can be simultaneously picked up, or to pick up the electronic parts separately when it is judged that the electronic can not be simultaneously picked up, and controlling the table and the nozzles to mount the electronic parts onto board.

DESCRIPTION OF THE PREFERRED EMBODIMENTS

First Embodiment

Figure 1:
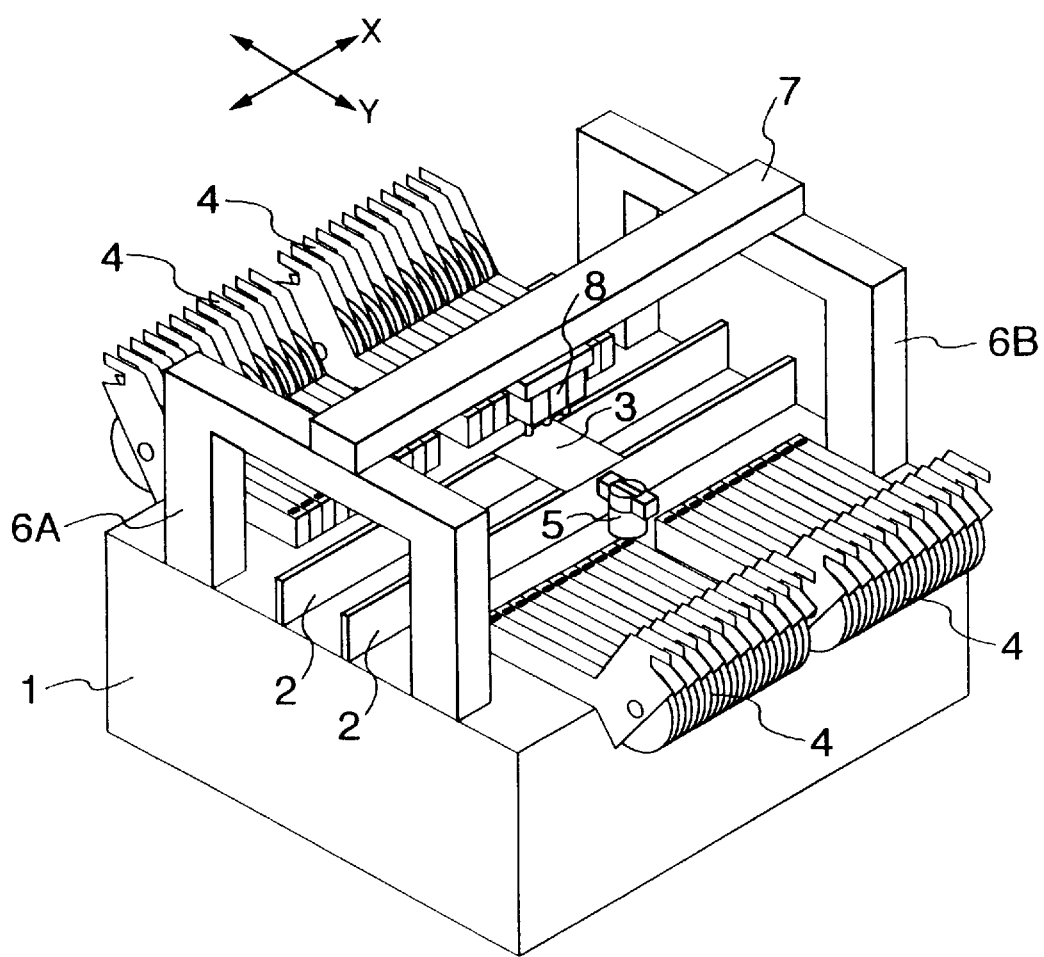
FIG. 1 is a perspective view of a first embodiment of an electronic parts mounting apparatus of the invention.
Figure 2:
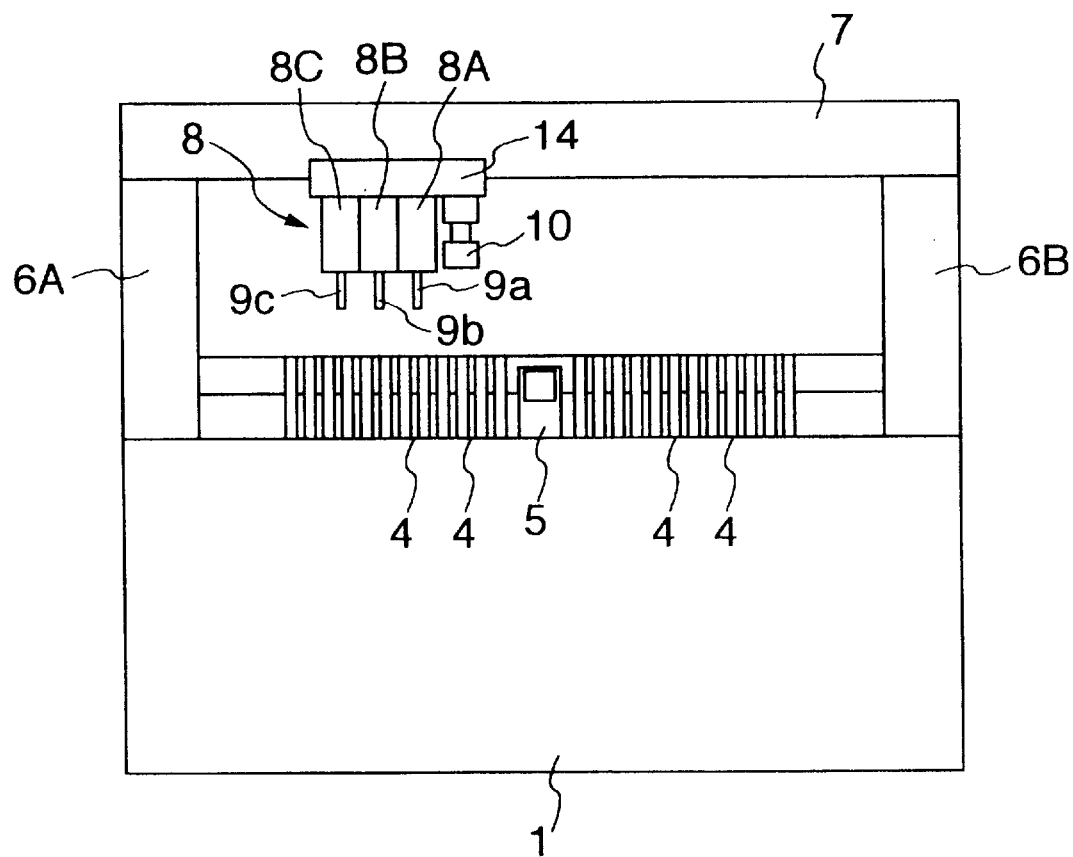
FIG. 2 is a front-elevational view of the electronic parts mounting apparatus of the first embodiment.

Referring to FIGS. 1 and 2, an electronic parts mounting apparatus includes two guide rails 2 mounted on an upper surface of a bed 1. A board 3 is conveyed along, and positioned by the guide rails 2. Namely, the guide rails 2 serve as a positioning section for the board 3. A number of parts feeders 4 are juxtaposed in a row on each sides of the guide rails 2. Various kinds of chips (electronic parts) are stored in the parts feeders 4. A first camera 5 is provided between the guide rail 2 and the parts feeders 4. As described later, the first camera 5 observes nozzles on a head 8.

In FIG. 1, Y-tables 6A and 6B are mounted on opposite edge portions of the bed 1, and an X-table 7 is mounted on and extended between the Y-tables 6A and 6B. The head 8 is attached to the X-table 7.

As shown in FIG. 2, the head 8 comprises a plurality of (three in this embodiment) head sections (a first head section 8A, a second head section 8B and a third head section 8C) juxtaposed in a row. These head sections 8A–8C have the first nozzle 9a, the second nozzle 9b and the third nozzle 9c, respectively.

The X-table 7 and the Y-tables 6A and 6B serve as a moving table for horizontally moving the head 8 in an X-direction and a Y-direction.

A second camera 10 is fixedly mounted on the head 8. As described later, the second camera 10 horizontally moves together with the head 8 without a relative movement therebetween.

The camera 10 observes the chips stored in the parts feeders 4 or pockets of tapes storing the chips. In this embodiment, description will hereafter be made, for example, of the case where he positions of the chips are observed, and the pick-up points of the chips are detected. The second camera 10 is used also to observe the board 3. In the present application, the direction of conveyance of the board 3 along the guide rails 2 is the X-direction.

Figure 3:
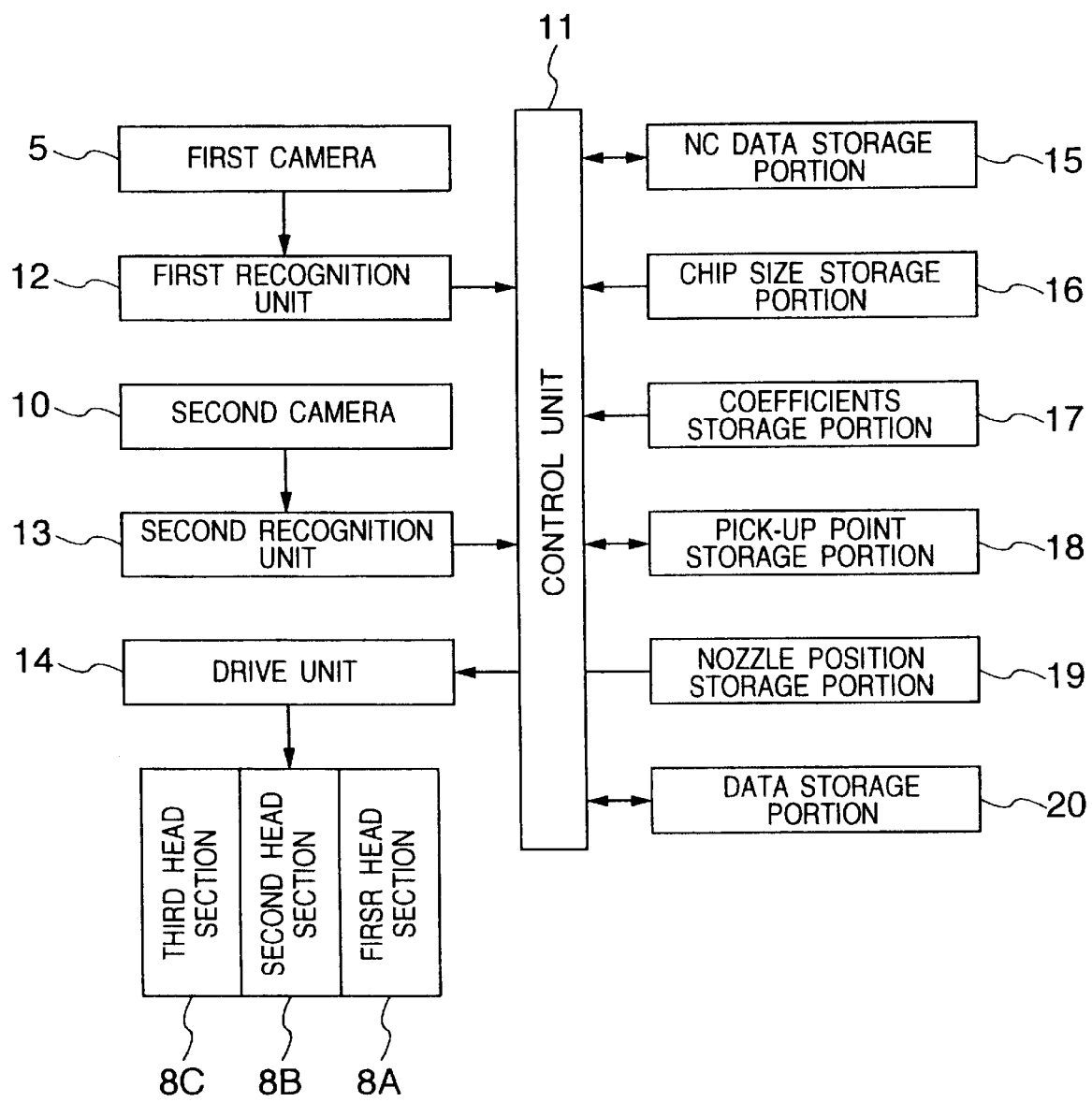
FIG. 3 is a block diagram of a control system of the electronic parts mounting apparatus of the first embodiment.

The apparatus further includes a control unit 11 shown in FIG. 3. A first recognition unit 12 is electrically connected to the first camera 5. The first recognition unit 12 processes image data of the nozzles taken by the first camera 5. In accordance with these data, the control unit 11 determines the positional relationship among the nozzles through calculation or computation.

A second recognition unit 13 is electrically connected to the second camera 10. The second recognition unit 13 processes image data of a position mark of the board and image data of the chips at the parts feeders 4, which data are taken by the second camera 10. In accordance with these data, the control unit 11 determines the position of the board 3 and the pick-up points through calculation.

A drive unit 14 is attached to the first head section 8A, the second head section 8B and the third head section 8C. The drive unit 14 moves the first nozzle 9a, the second nozzle 9b and the third nozzle 9c upward and downward in accordance with commands from the control unit 11. The drive unit 14 can move these nozzles 9a–9c simultaneously or separately.

The storage portions 15–20 are electrically connected to the control unit 11.

A NC data storage portion 15 stores program data including data related to the mounting order of the chips and the mounting positions of the chips.

A chip size storage portion 16 stores the lengthwise and widthwise dimensions of the chips.

A coefficients storage portion 17 stores coefficients used for calculating tolerance zones (described later) for the picking-up.

A pick-up point storage portion 18 stores the picking-up points of the chips in the parts feeders 4.

A nozzle position storage portion 19 stores the positional relationship among the first, second and third nozzles 9a, 9b and 9c taken by the first camera 5.

A data storage portion 20 stores data related to a combination of the parts feeders 4 scheduled to undergo the simultaneous picking-up, and other various data necessary for the mounting of the chips.

Naturally, the parts feeders 4, scheduled to undergo the simultaneous picking-up, are located respectively at their positions suited for the simultaneous picking-up. The control unit 11 effects various calculations and judgments, and controls the various elements.

An operation of the electronic parts mounting apparatus thus constructed is described hereinafter in brief.

The head 8 is moved horizontally above the chips on the selected three parts feeders 4. Three nozzles 9a–9c are moved downwards to pick up the chips, and then moved upwards with holding the chips. The head 8 is moved back above the board 3. The nozzles 9a–9c are moved downwards again and release the chip to place hem on the board 3. Thereafter, the nozzles 9a–9c are moved twards. These actions are repeated.

A chip picking-up decision will be described hereinafter in detail with referring to FIG. 4. This decision determines whether the simultaneous pick-us is to be conducted or not.

First, in Step 1, the head 8 is moved to a position above the first camera 5. It observes the three nozzles 9a to 9c. The control unit 11 detects a positional relationship among the nozzles 9a to 9c in accordance with the image data of the nozzles 9a to 9c taken by the first camera 5. The position data of the detected positional relationship among the nozzles 9a to 9c are stored in the nozzle position storage portion 19 (FIG. 3).

Figure 5:
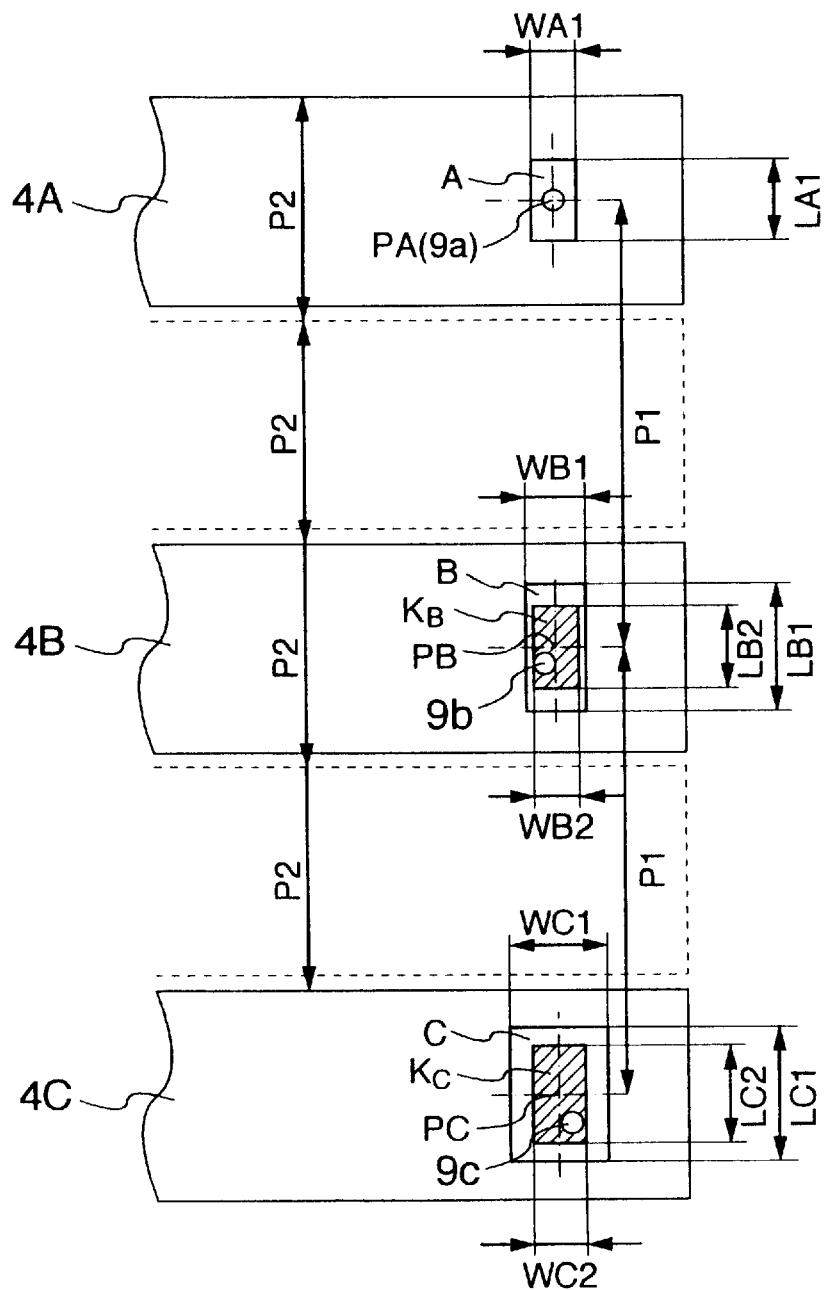
FIG. 5 is a plan view showing distal end portions of parts feeders in the electronic parts mounting apparatus of the first embodiment in case of simultaneous picking-up operation.

In Step 2, the second camera 10 is moved to a position above each of the selected parts feeders 4A to 4C. It observes the chips A to C at foremost positions (pick-up points) in the parts feeders 4A to 4C. The reference numerals 4A, 4B and 4C respectively denote the parts feeders from which the nozzles 9a, 9b and 9c pick up the chips, and the reference numerals A, B and C respectively denote the foremost chips (that is, the chips to be picked up) stored respectively in the parts feeders 4A to 4C (FIG. 5). The control unit 11 detects the chip pick-up points PA, PB and PC of the respective parts feeders 4A to 4C. The data of the detected pick-up points PA, PB and PC are stored in the pick-up point storage portion 18 (FIG. 3).

Incidentally, each of the parts feeders 4 includes a tape for storing the electronic parts (chips) as disclosed in Japanese Patent Unexamined Publication No. 5-75294, and the chips are stored respectively in pockets of this tape. While the tape is fed intermittently by a feeding means such as a sprocket, each time the nozzles 9a to 9c are moved downwardly, the foremost (leading) chip is held by vacuum suction by the lower end of the nozzle, and is picked up.

The operations of Step 1 and Step 2 are effected before the mounting of the chips is carried out, and also when the pick-up conditions are changed (for example, when the parts feeders 4 are exchanged, when the arrangement of the parts feeders 4 is changed, or when the nozzles 9a to 9c are exchanged).

When the operations of Step 1 and Step 2 are finished or the pick-up conditions are not changed (Step 0), the processing or program proceeds to Step 3. In Step 3, one (the first nozzle 9a in this embodiment) of the three nozzles 9a to 9c is selected as a reference nozzle. The positions of the other nozzles (the second and third nozzles 9b and 9c in this embodiment), when the reference nozzle 9a would be brought into the pick-up point PA of the parts feeder 4A of the parts feeders 4A to 4C scheduled to undergo the simultaneous picking-up, are calculated (FIG. 5).

The operation of Step 3 will be described hereinafter with referring to FIG. 5 in which reference numerals LA1, LB1, and LC1 denote lengthwise dimensions of the chips A, B, and C, respectively, and reference numerals WA1, WB1, and WC1 denote widthwise dimensions of the chips A, B, and C, respectively. These dimensions are beforehand stored as chip data in the chip size storage portion 16 (Fig.3).

The interval P1 among the three nozzles 9a, 9b and 9c is set to an integral multiple of the interval P2 among the parts feeders 4A, 4B and 4C (P1=2×P2 in this embodiment). However, as described above in the "Related Art" of this specification, there are errors in the intervals P1 and P2, and therefore three nozzles 9a to 9c can not always simultaneously pick up the chips A to C in the parts feeders 4A to 4C by suction.

In FIG. 5, rectangular areas indicated by hatching within the respective chips represent tolerance zones K. If the nozzle lands within such tolerance zone K, the nozzle can pick up the chip, but if the nozzle lands outside the zone K, the nozzle can not pick up the chip. Lengthwise dimension (LB2, LC2) and widthwise dimension (WB2, WC2) of the tolerance zones KB and KC for the chip B and the chip C are determined by the following formulas: Namely, there are provided LB2=f1×LB1, WB2=f2×WB1, LC2=f3×LC1, and WC2=f4×WC1.

The coefficients f1, f2, f3 and f4 are obtained from test results, experience and so on, and are stored in the coefficient storage portion 17 (FIG. 3).

In Step 4, it is judged whether or not the second nozzle 9b and the third nozzle 9c will be disposed within the tolerance zones KB and KC, respectively, if the first nozzle 9a is placed to coincide with the pick-up point PA, according to the above-mentioned data stored in the storage portions 16 to 19. In the example shown in FIG. 4, the second nozzle 9b and the third nozzle 9c will be disposed within the tolerance zones KB and KC, respectively , if the first nozzle 9a is placed to coincide with the pick-up point PA. In this case, the judgment result is "YES", and the processing proceeds to Step 5. Namely, the simultaneous picking-up of the chips A to C is decided.

Figure 6:
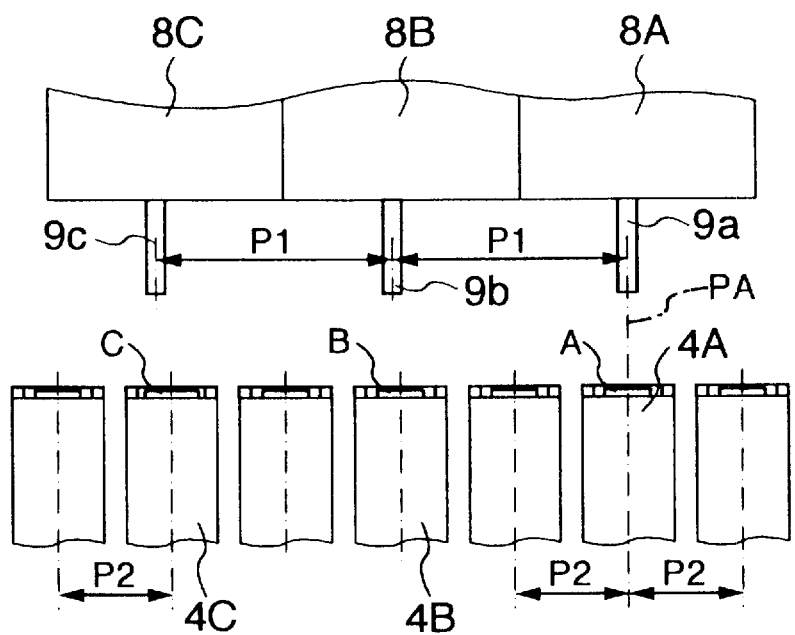
FIGS. 6–8 are front-elevational views showing simultaneous picking-up operations of nozzles in the electronic parts mounting apparatus of the first embodiment, respectively.
Figure 7:
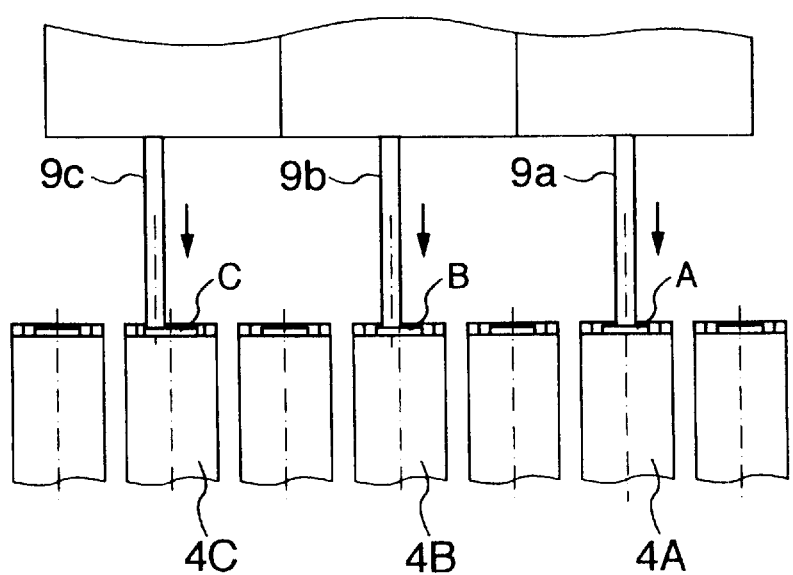
Figure 8:
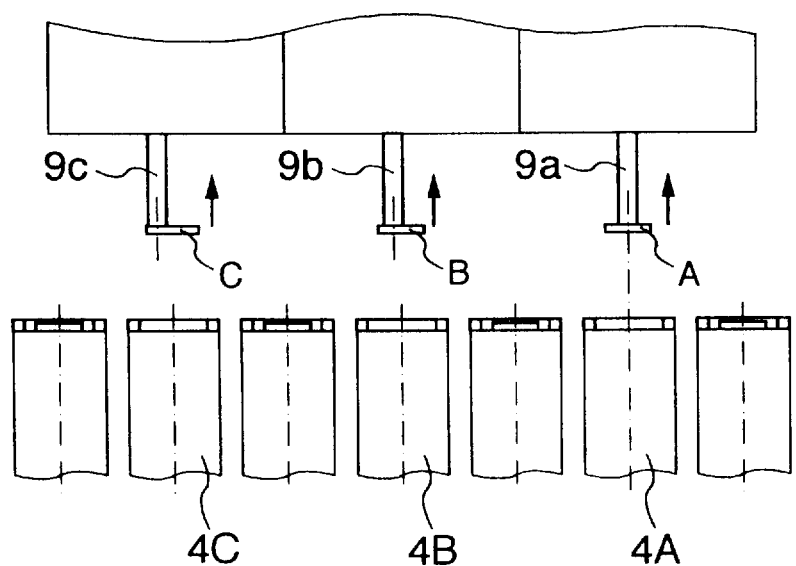

Therefore, all of the nozzles 9a–9c are simultaneously moved vertically to pick up the respective chips A to C by suction as shown in FIGS. 6 to 8.

To the contrary, it is judged that the second nozzle 9b and/or the third nozzle 9c will be beyond the tolerance zone KB or KC, the judgment result in Step 4 is "NO", and the processing proceeds to Step 6. Namely, a separate picking-up of the chips A to C is decided.

Figure 9:
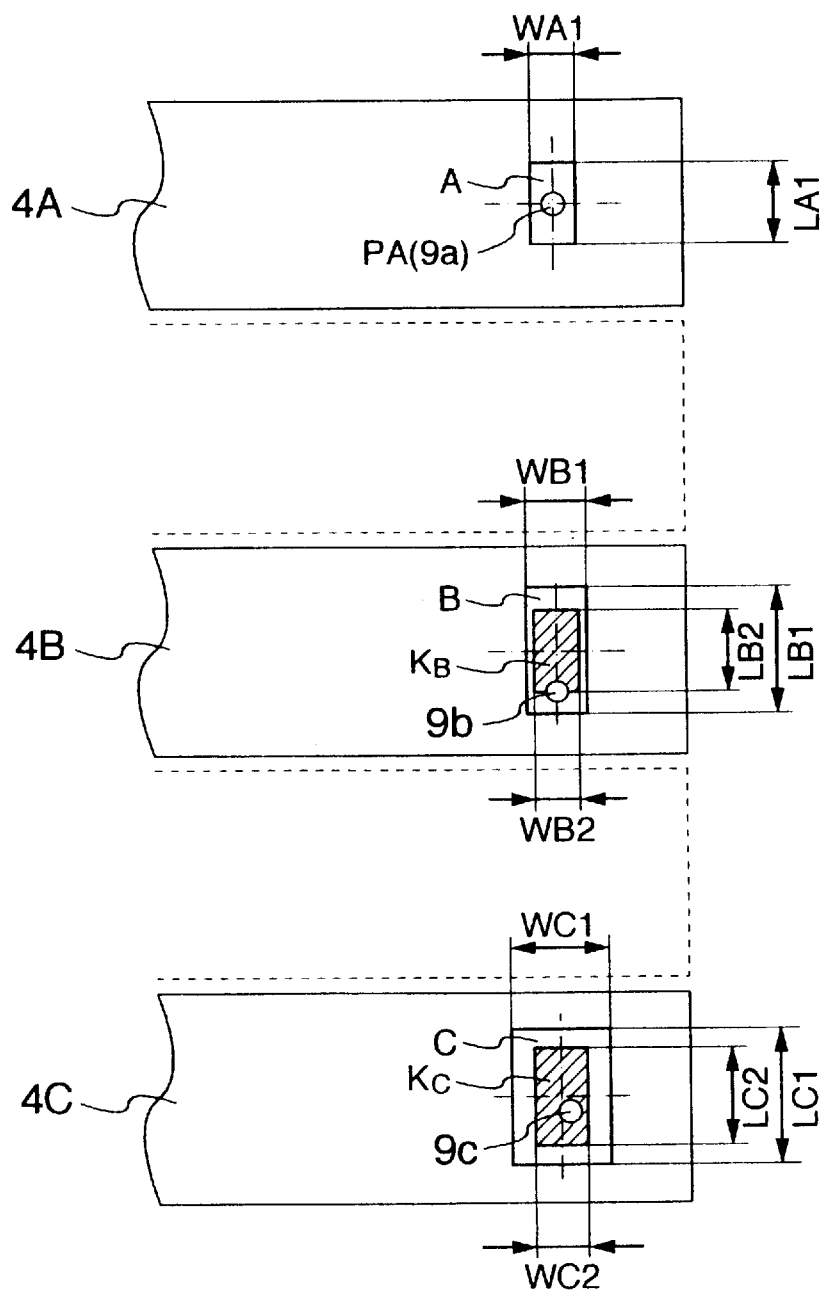
FIG. 9 is a plan view showing distal end portions of parts feeders in the electronic parts mounting apparatus of the first embodiment in case of separate picking-up operation.

FIG. 9 shows the case where the judgment result in Step 4 is "NO". In this case, the second nozzle 9b will be disposed outside the tolerance zone KB although the third nozzle 9c will be disposed within the tolerance zone KC, if the first nozzle 9a is placed to coincide with the pick-up point PA. Therefore, in this condition, even if all of the nozzles 9a to 9c are operated so as to effect the simultaneous picking-up operation, it is expected that the second nozzle 9b fails to pick up the chip B. Therefore, in this case, the separate picking-up is decided.

Figure 10:
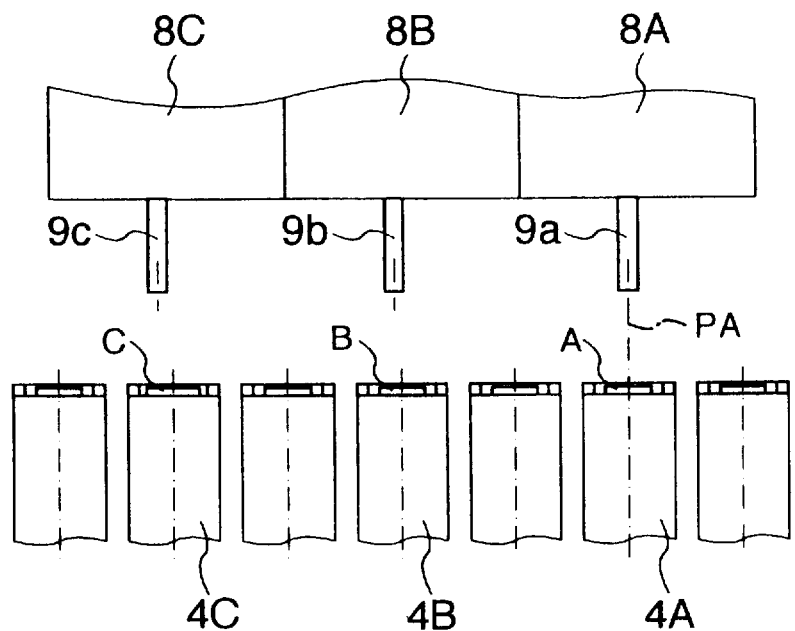
FIGS. 10–15 are front-elevational views showing separate picking-up operations of nozzles in the electronic parts mounting apparatus of the first embodiment, respectively.
Figure 11:
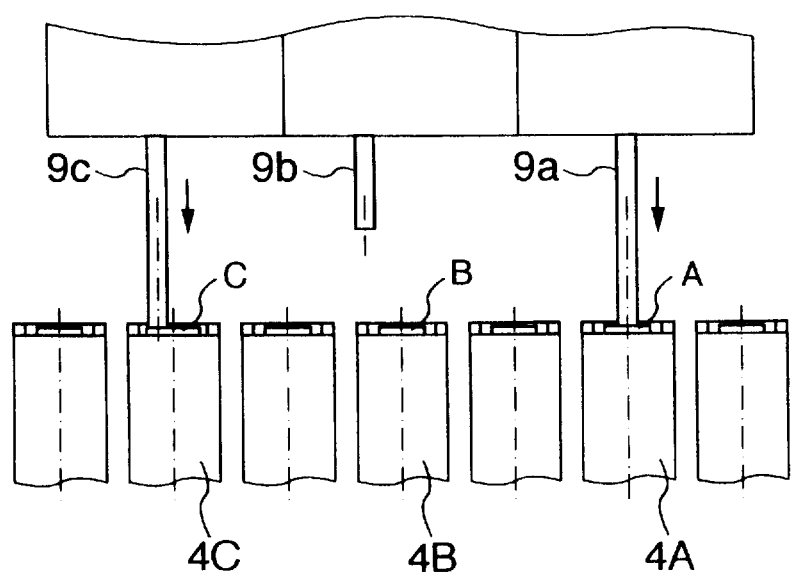
Figure 12:
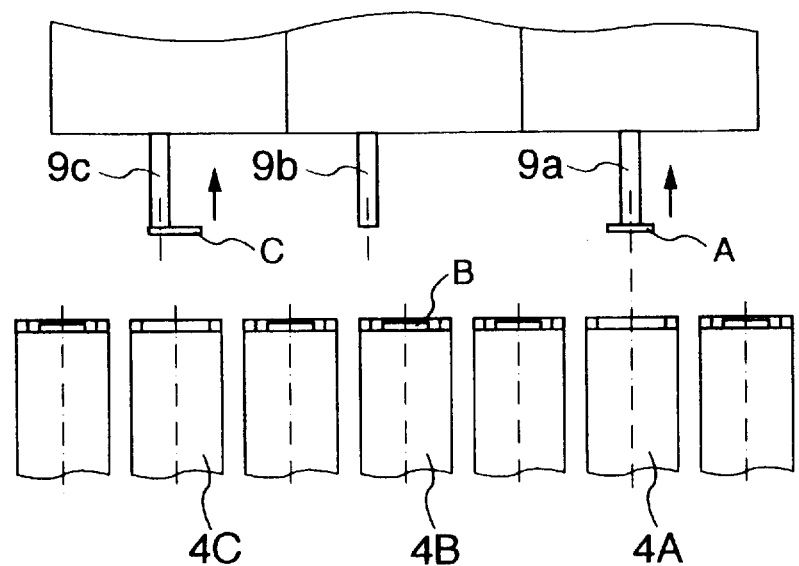
Figure 13:
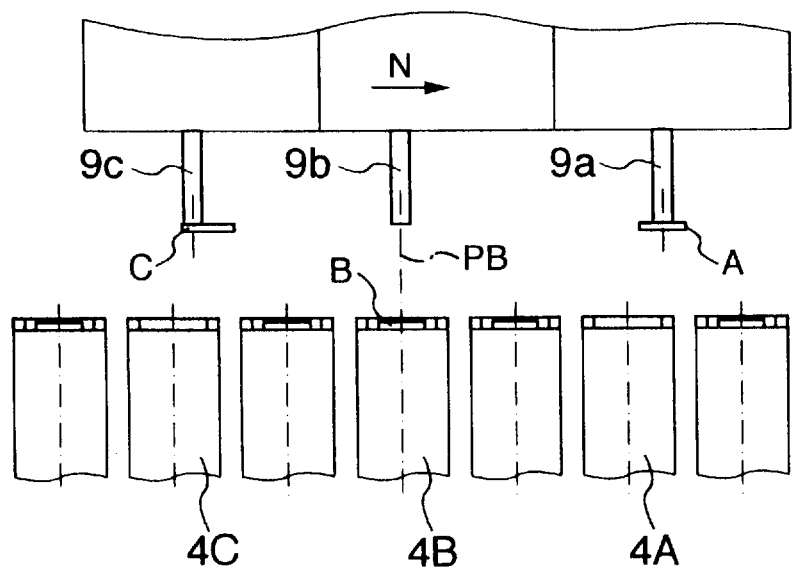
Figure 14:
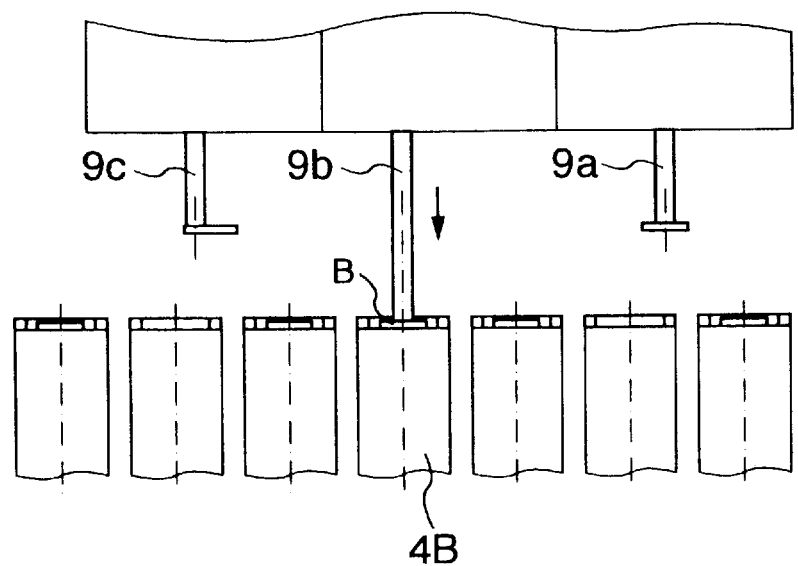
Figure 15:
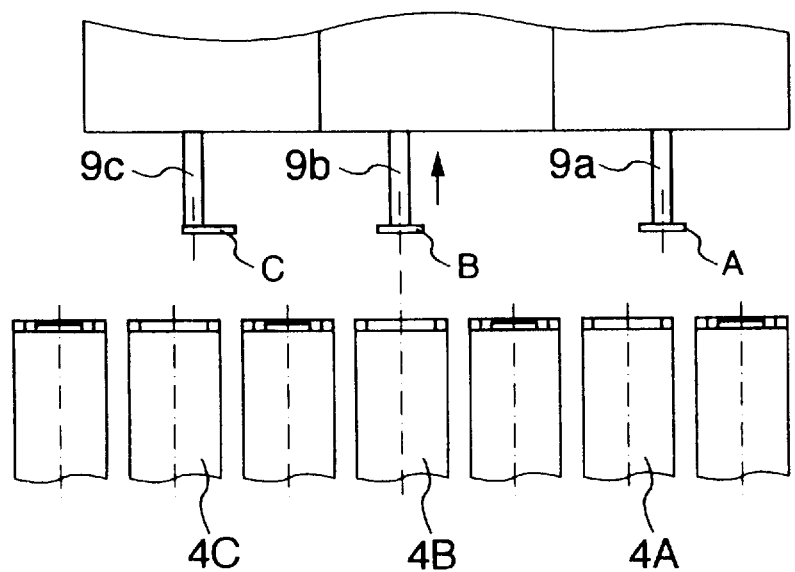

The operation of the separate picking-up will be described hereinafter with referring to FIGS. 10 to 15. Firstly, only the first and third nozzles 9a and 9c are moved downwards to pick up the respective chips A and C, while the second nozzle 9b remains (FIGS. 10 and 11). The first and third nozzles 9a and 9c are moved upwards (FIG. 12). Thereafter, the second nozzle 9b (head 8) is moved horizontally into the tolerance zone KB as indicated by an arrow N in FIG. 13. After the second nozzle 9b coincides with a pick-up point PB, only the second nozzle 9b is moved downwards to pick up the chip B, and thereafter the second nozzle 9b is moved upwards, as shown in FIGS. 14 and 15.

In this case, all of the three nozzles 9a to 9c do not simultaneously pick up the respective chips A to C, but the chip pick-up operation is repeated several times so that three nozzles 9a to 9c pick up the respective chips. In this embodiment, the pick-up operations are repeated twice, that is, at the first picking-up operation, the first and third nozzles 9a and 9c pick up the chips A and C, and at the second picking-up operation, the second nozzle 9b picks up the chip B. This is referred to as "separate picking-up" in the present application.

In Step 4, if neither the second nozzle 9b nor the third nozzle 9c is within their respective tolerance zones KB and KC, the three nozzles 9a to 9c pick up the respective chips one by one with repeating the separate picking-up.

As described above, the processing of Steps 3 to 6 are effected for all of the parts feeders 4 scheduled to undergo the simultaneous picking-up. The information related to which step is selected between Steps 5 and 6 is stored in the data storage portion 20. When actually mounting the chips on the board 3, it is effected while referring to such information stored in the data storage portion 20.

Second Embodiment

Figure 17:
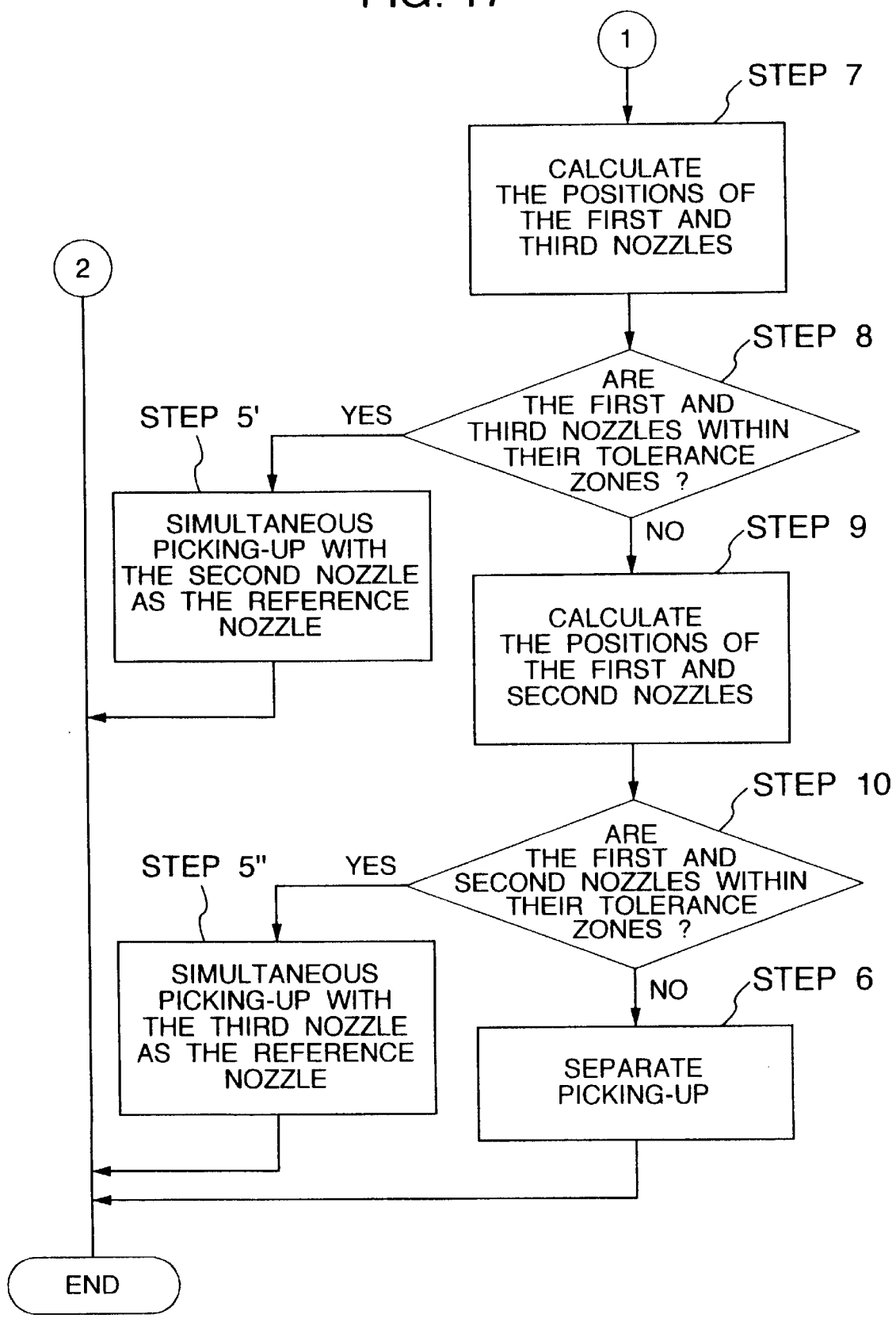
Figure 18:
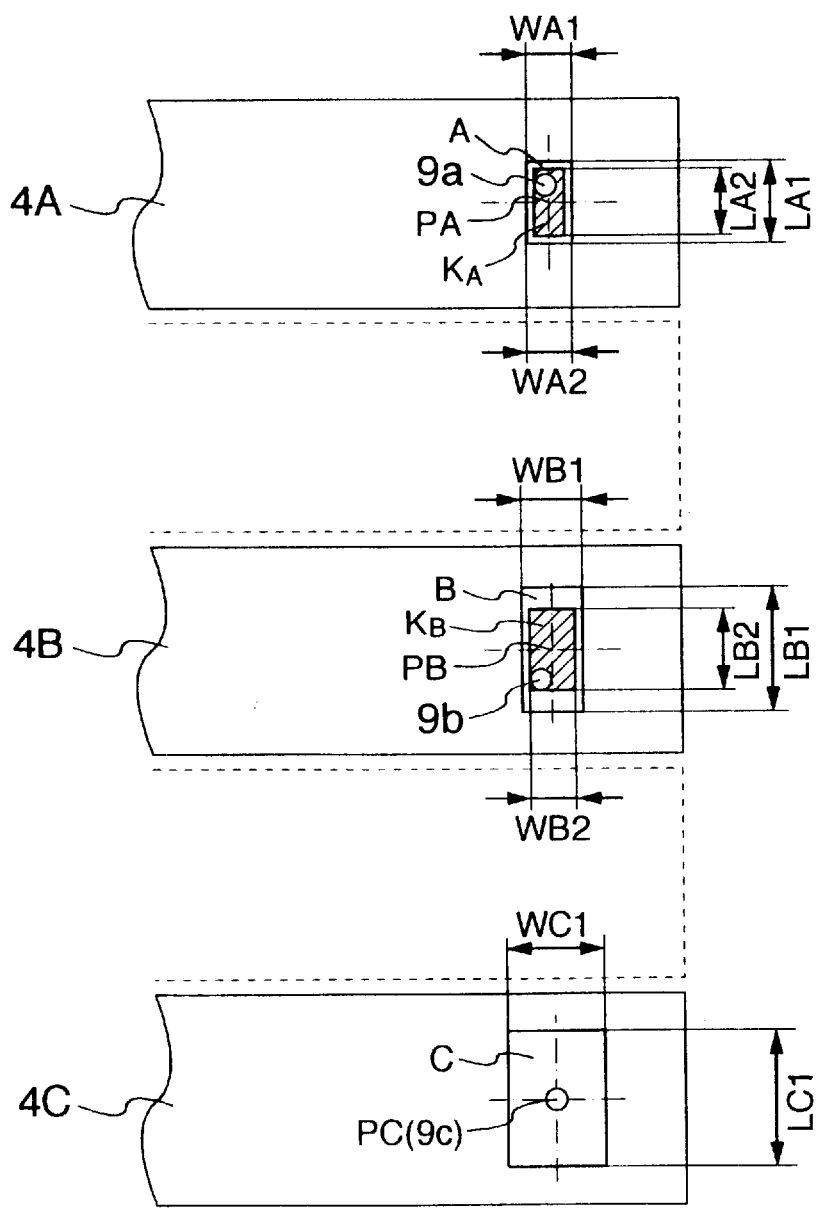
FIG. 18 is a plan view showing distal end portions of parts feeders of an electronic parts mounting apparatus of the second embodiment.

In the first embodiment, only one 9a of the three nozzles 9a to 9c is selected as the reference nozzle, and it is judged whether another two nozzles 9b and 9c can simultaneously pick up the corresponding chips. To the contrary, in the second embodiment, each of the three nozzles 9a to 9c is selected as the reference nozzle, and it is judged each time whether another two nozzles can simultaneously pickup the corresponding chips. The judgment procedure of the second embodiment will now be described with reference to FIGS. 16 to 18.

Figure 4:
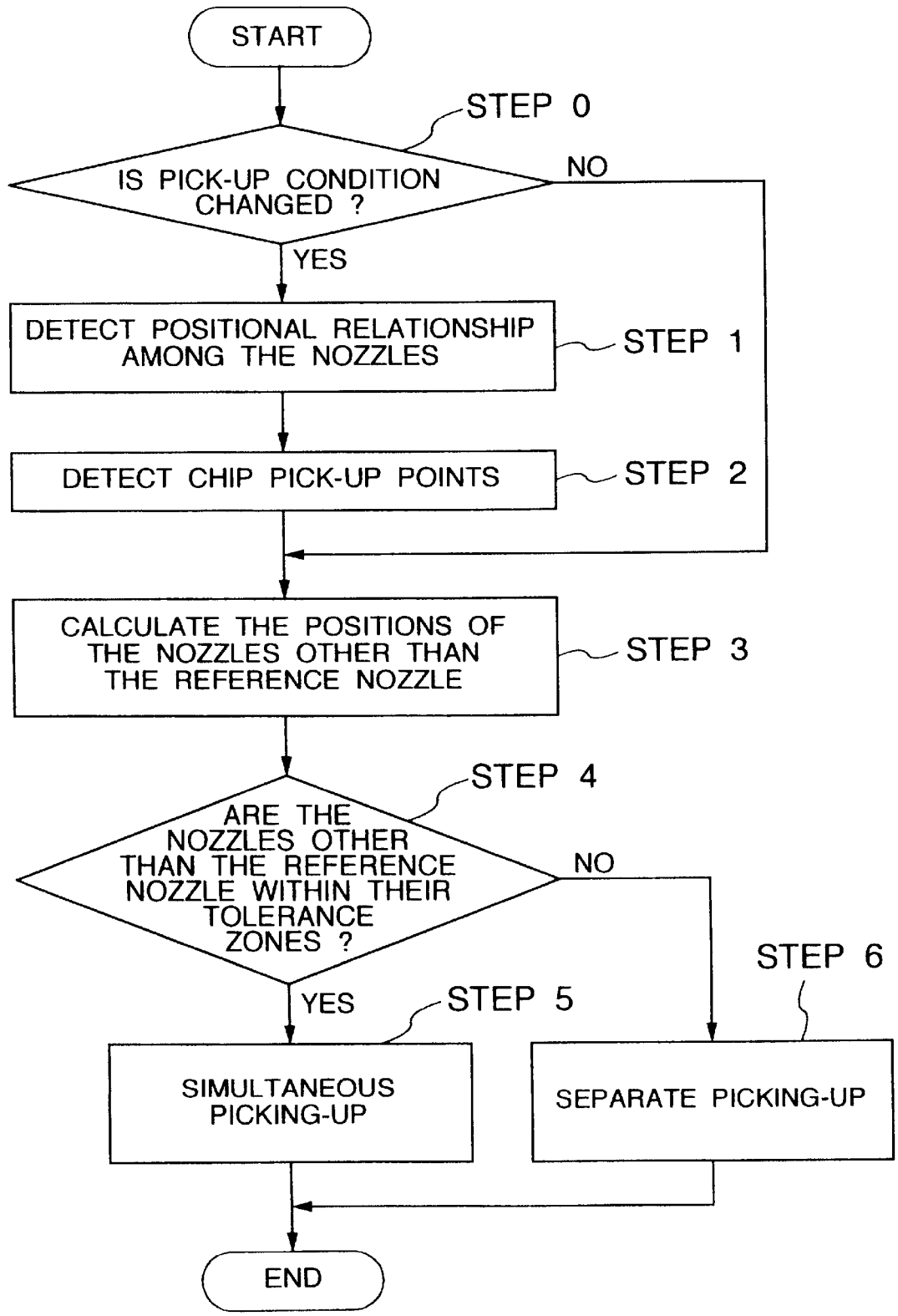
FIG. 4 is a flow chart of a pick-up operation for chips in the electronic parts mounting apparatus of the first embodiment.
Figure 16:
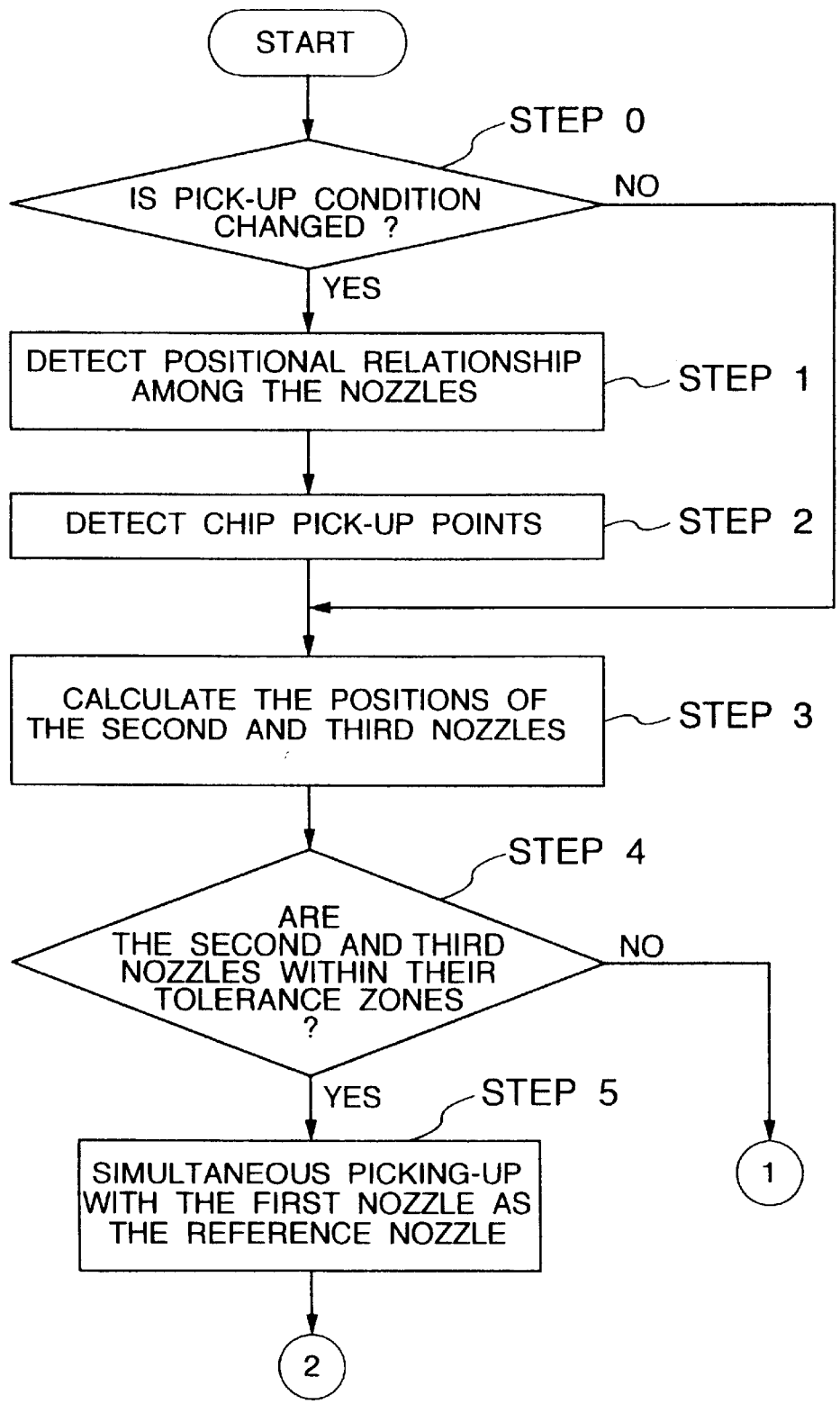
FIGS. 16–17 are flow charts of a pick-up operation for chips in the electronic parts mounting apparatus of the second embodiment.

Steps 1 to 5 in FIG. 16 are similar respectively to Steps 1 to 5 in FIG. 4, and therefore detailed description thereof will be omitted. If the judgment result in Step 4 is "YES", the program proceeds to Step 5 where the simultaneous picking-up with the first nozzle 9*a* being placed to coincide with the pick-up point PA is decided. If "NO", the program proceeds to Step 7.

In Step 7, the second nozzle 9*b* is selected as the reference nozzle. The positions of the other nozzles 9*a* and 9*c* are calculated.

In Step 8, it is judged whether or not the other nozzles 9*a* and 9*c* will be disposed within the respective tolerance zones KA and KC, if the second nozzle 9*b* is placed to coincide with the pick-up point PB. If the judgment result is "YES", the processing proceeds to Step 5' where the simultaneous pickingup with the second nozzle 9*b* being placed to coincide with the pick-up point PB is decided. If "NO", the program proceeds to Step 9.

In Step 9, the third nozzle 9*c* is selected as the reference nozzle. The positions of the other nozzles 9*a* and 9*b* are calculated.

In Step 10, it is judged whether or not the other nozzles 9*a* and 9*b* will be disposed within the respective tolerance zones KA and KB, if the third nozzle 9*c* is placed to coincide with the pick-up point PC. If the judgment result is "YES", namely the relationship among the chips A to C and the nozzles 9*a* to 9*c* is shown for example in FIG. 18, the program proceeds to Step 5" where the simultaneous picking-up with the third nozzle 9*c* being placed to coincide with the pick-up position PC is decided. If "NO", the program proceeds to Step 6 where it is decided to carry out the separate picking-up.

As described above, Steps 3 to 10 are effected for all of the parts feeders 4 scheduled to undergo the simultaneous picking-up, and the chips are mounted in a manner as described for the first embodiment.

In the second embodiment, first, the first nozzle 9*a* is selected as the reference nozzle, and it is judged whether or not the simultaneous picking-up by the three nozzles 9*a* to 9*c* is possible (Step 4). If the judgment result is "NO", the second nozzle 9*b* is selected as the reference nozzle, and the similar judgment is effected (Step 8). If the judgment result is "NO", the third nozzle 9*c* is further selected as the reference nozzle, and the similar judgment is effected (Step 10). When it is judged that the simultaneous picking-up is impossible even if any of the nozzles 9*a* to 9*c* is selected as the reference nozzle, the separate picking-up is employed (Step 6).

In other words, the simultaneous picking-up can be employed when the judgment result is "YES" in any one decision step (Steps 4, 8, and 10). Therefore, in the second embodiment, the probability of the simultaneous picking-up is higher than in the first embodiment and the separate picking-up, which requires a longer task time, is avoided as much as possible, so that the mounting efficiency can be enhanced.

In the electronic parts mounting method of the present invention for picking up the chips respectively from the plurality of parts feeders by the plurality of nozzles, it is beforehand judged whether or not the chips in the plurality of parts feeders can be simultaneously picked up respectively by the plurality of nozzles. When it is judged that there exists any nozzle which will be subjected to a pick-up mistake, the picking-up operation of this nozzle is canceled, thereby preventing such a pick-up mistake, so that the mounting efficiency is enhanced.

What is claimed is:

1. An electronic parts mounting method for horizontally moving a head with a plurality of nozzles arranged at a first interval therebetween, and for picking-up electronic parts from plural ones of numbers of parts feeders arranged at a second interval therebetween by means of said nozzles, the first interval set to be an integral multiple of the second interval, and for mounting said electronic parts onto a board, said method comprising the steps of:

detecting a positional relationship among said nozzles by a first camera, and storing data of the positional relationship in a storage portion;

detecting pick-up points of said electronic parts in said plural parts feeders by a second camera, and storing data of the pick-up points in a storage portion;

judging, in accordance with said positional relationship data and said pick- up point data, whether or not all of said electronic parts can be simultaneously picked up by said nozzles;

picking up said electronic parts by said nozzles simultaneously when it is judged that all of said electronic parts can be simultaneously picked up, or separately when it is judged that all of said electronic parts can not be simultaneously picked up; and transferring and mounting said electronic parts on said board.

2. A method according to claim 1, in which said judgment is made by judging whether or not said nozzles are located respectively within predetermined zones at said pick-up points.

3. A method according to claim 2, in which each of said predetermined zones is determined in accordance with dimensions of the associated electronic part.

4. A method according to claim 1, in which when picking up said electronic parts by said nozzles simultaneously, one of said nozzles is selected as a reference nozzle, and said reference nozzle is placed to coincide accurate with the pick-up point of the corresponding electronic part.

5. Electronic parts mounting apparatus for picking up electronic parts from plural parts feeders by plural nozzles and mounting them onto a board, said apparatus comprising:

a positioning portion on which said board is placed;

numbers of parts feeders arranged at a first interval, including said plural parts feeders;

a head having said plural nozzles mounted thereon at a second interval which is set an integral multiple of said first interval;

a table for horizontally moving said head;

a first camera for detecting a positional relationship among said plural nozzles;

a second camera for detecting pick-up points of said electronic parts;

a storage portion for storing the data of said nozzle positional relationship and the data of said pick-up points;

means for judging, in accordance with said nozzle positional relationship. data and said pick-up point data, whether or not all of said plural electronic parts can be simultaneously picked up by said plural nozzles; and means for controlling said nozzles to pick up all of said electronic parts simultaneously when it is judged that said electronic parts can be simultaneously picked up, or to pick up said electronic parts separately when it is judged that said electronic parts can not be simultaneously picked up, and controlling said table and said nozzles to mount said electronic parts onto board.

* * * * *